United States Patent [19]
Decramer et al.

[11] Patent Number: 6,100,772
[45] Date of Patent: Aug. 8, 2000

[54] HIGH FREQUENCY TEST BALUN WITH A CAPACITOR ACROSS THE OUTPUT

[75] Inventors: John E. Decramer, Marshall; Nathan Doose, Granite Falls, both of Minn.

[73] Assignee: BH Electronics, Inc., Burnsville, Minn.

[21] Appl. No.: 09/192,724

[22] Filed: Nov. 16, 1998

[51] Int. Cl.[7] ........................................... H03H 7/42
[52] U.S. Cl. .................................... 333/25; 333/32
[58] Field of Search ............................ 333/25, 32

[56] References Cited

U.S. PATENT DOCUMENTS

| | | | |
|---|---|---|---|
| 5,420,551 | 5/1995 | Conte et al. | 333/25 X |
| 5,495,212 | 2/1996 | DeCramer | 333/25 |

*Primary Examiner*—Justin P. Bettendorf
*Attorney, Agent, or Firm*—Douglas J. Christensen

[57] ABSTRACT

A passive, highly efficient, low noise adapter device includes a balun and noise reduction circuitry uniquely configured to converting an unbalanced signal line on a 50 ohm signal line to a balanced signal on a 100 ohm transmission line or vice versa. The device facilitates the use of commercially available and accepted test equipment for accurate transmission measurements on balanced twisted pairs of cables and connectors. A typical utilizational includes an adapter device connected between the 100 ohm twisted pair cable and suitable test equipment such as a network analyzer and/or a signal generator for determining losses in the telephone wire and connectors.

12 Claims, 5 Drawing Sheets

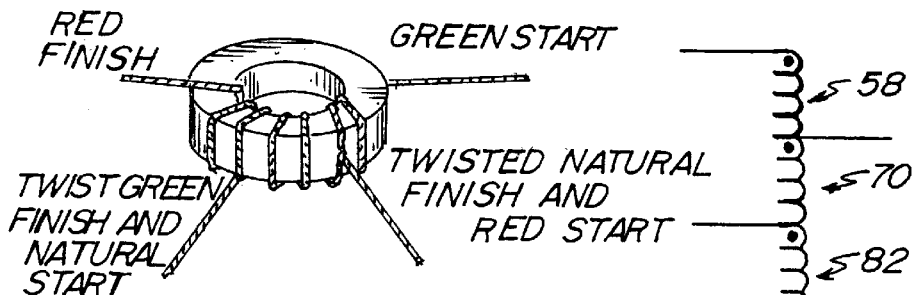
Fig. 10A.
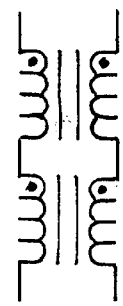
Fig. 10B.
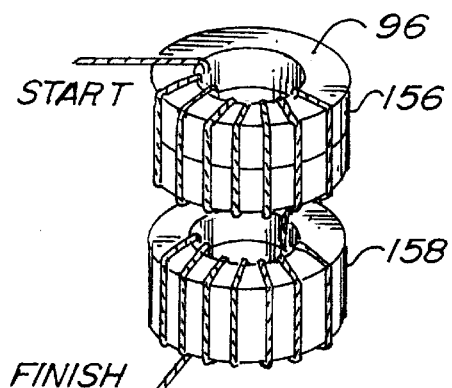
Fig. 11A.
Fig. 11B.
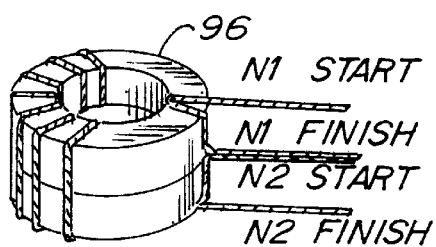
Fig. 12A.
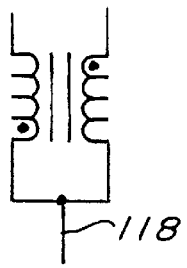
Fig. 12B.

HIGH FREQUENCY TEST BALUN WITH A CAPACITOR ACROSS THE OUTPUT

BACKGROUND OF THE INVENTION

The present invention relates to transmission systems for video and data signals. More specifically the invention relates to a low noise adapter device which is suitable for coupling testing equipment to a balanced two wire unshielded twisted pair for testing same.

Cable television (CATV) is transmitted over 75 ohm coaxial cable. Channels 2–60 are transmitted on the cable at frequencies ranging from 5 to 500 MHz. Many homes and commercial buildings have previously installed telephone cables consisting of unshielded twisted pairs. The standard unshielded twisted pairs (UTP) of telephone cables have a characteristic impedance of 100 ohms. It is often convenient to utilize this cable for transmission of video signals. Perhaps more significantly, UTP cable may also be utilized for transmission of computer data signals. Currently such cable and applications, such as local area networks, transmit computer data in the 20 to 30 MHz range. In the foreseeable future such transmission speeds on such cable may exceed 100 MHz.

There are difficulties associated with using the unshielded twisted pair cable for the above, particularly the transmission of CATV signals. Any attempt to utilize the UTP cable with unbalanced CATV signals or other unbalanced signals will result in unacceptable radiation and attenuation of the signals. Techniques such as shown in U.S. Pat. Nos. 5,633,614 and 5,495,212 also assigned to the owner of the instant invention, provide generally acceptable matching of the CATV coaxial cable with the UTP cable.

It is often useful or necessary to measure the balance and other characteristics of UTP cable particularly with reference to the potential usage of such cable for carrying CATV or data signals. Appropriate test equipment for performing such measurements, including network analyzers and signal generators, generally have a characteristic impedance of 50 ohms. Thus, attempts to make any quality measurements of the cable or other associated equipment such as connectors is impossible without suitably matching the test equipment characteristic impedance with that the UTP cable. Heretofore baluns and adapters suitable for such coupling had a restricted frequency range, for example up to 100 MHz. An adapter device is needed which offers high performance low noise coupling up to and beyond 350 MHz.

SUMMARY OF THE INVENTION

A passive, highly efficient, low noise adapter device includes a balun and noise reduction circuitry uniquely configured to converting an unbalanced signal line on a 50 ohm signal line to a balance signal on a 100 ohm transmission line or vice versa. The device facilitates the use of commercially available and accepted test equipment for accurate transmission measurements on balanced twisted pairs of cables and connectors. A typical utilizational includes an adapter device connected between the 100 ohm twisted pair cable and suitable test equipment such as a network analyzer and/or a signal generator for determining losses in the telephone wire and connectors.

A feature and advantage of preferred embodiments of the invention is that a much higher band width is provided by the device compared to conventional adapters.

A feature and advantage of preferred embodiments is that the device provides excellent noise reduction characteristics over the entire band width of the device.

DESCRIPTION OF THE DRAWINGS

FIG. 10A is a perspective view of the balun (T1) showing the windings.

FIG. 10B is a schematic figure of the balun (T1).

FIG. 11A is a perspective view of the common mode choke (T2).

FIG. 11B is a schematic view of the common mode choke (T2).

FIG. 12A is a perspective view of the signal splitter (T3).

FIG. 12B is a schematic view of the signal splitter (T3).

DETAILED DESCRIPTION

The use of input and output as used herein as a matter of convention for differentiating the ports on the device and does indicate or require that the signals must be transmitted in a particular direction through the device. As illustrated in the figures and as discussed below signals are transmitted in either direction through the device. This application is related to the parent applications assigned to the same inventor U.S. Pat. Nos. 5,633,614 and 5,495,212. The techniques for providing the low noise, highly efficient coupling devices of the '614 and '212 patents are applicable to the invention disclosed herein. Said patents are hereby incorporated by reference.

Figure 1:
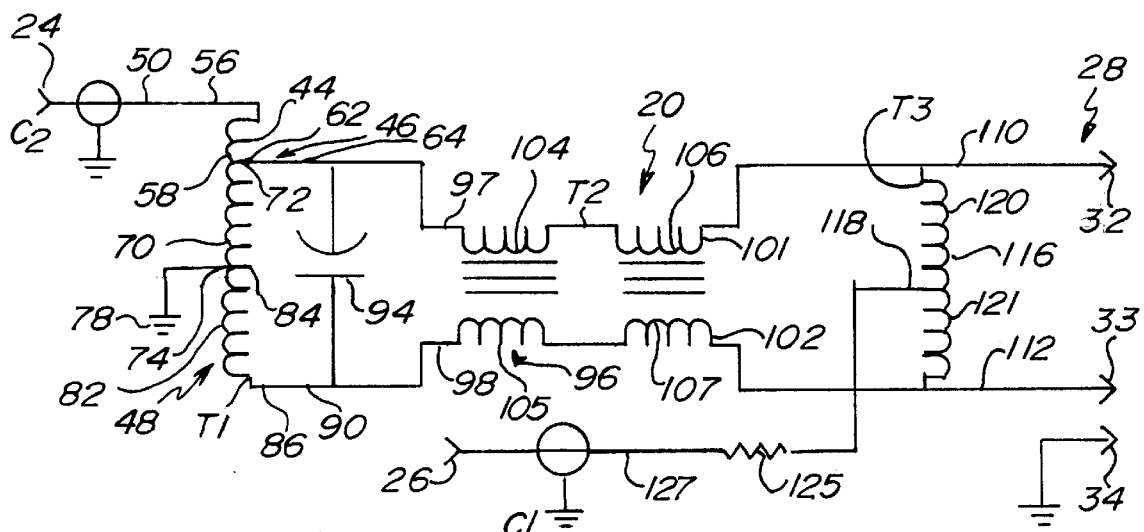
FIG. 1 is a electrical schematic diagram of the circuitry of an embodiment of the invention.
Figure 2:
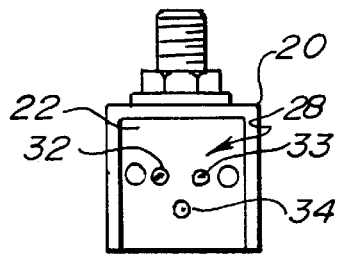
FIG. 2 is an end elevational view of a device embodying the invention.
Figure 3:
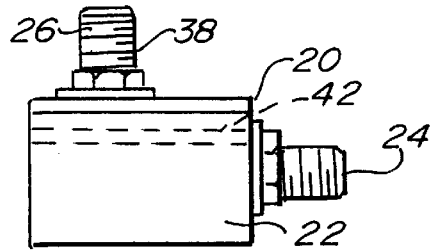
FIG. 3 is a front elevational view of the device of FIG. 2.

Referring to FIGS. 1, 2, and 3, the adapter device, enumerated 20, is shown in schematic form and as a component part. The adapter device generally comprises a housing 22 through which extend a first unbalanced input port 24, a second unbalanced input port 26, and a balanced output port 28. The balanced output port has two signal connectors 32, 33 and also has a grounded connector 34. The balanced output port signal connectors 32, 33 directly receive stripped wire of the unshielded twisted pair. The unbalanced input ports have coaxial type connectors 38 which may be SMA connectors or other suitable coaxial connectors.

Positioned in the housing, is a circuit board 42 as indicated by the dotted line in FIG. 3 which generally holds the components as indicated in the schematic of FIG. 1. The input port is connected to a balun 44 by a signal conductor 50 which extends to a first end 56 of a first winding 58. A second end 62 of the first winding connects to or comprises a first balun output lead 64. A second balun winding 70 has a first end 72 connecting to the first balun output lead and a second end 74 connecting to the circuit ground 78.

A third winding 82 has a first end 84 connecting to circuit ground 78 and a second end 86 connecting to a second balun output lead 90. A capacitor 94 extends across the first balun output lead 64 and the second balun output lead 90 and provides some suppression of high frequency parasitics.

A longitudinal common mode choke 96 has a pair of input leads 97, 98 and a pair of output leads 101, 102. The longitudinal choke 96 has a first winding 104, a second winding 105, a third winding 106, and a fourth winding 107. The output leads 101, 102, are connected to first and second conductors 110, 112 of output port 28. A signal splitter 116 extends across the first and second conductors of the output port and has a center tap 118 between a first winding 120 and a second winding 121.

The center tap 118 of the splitter is connected to a resistor 125 which connects to the signal conductor 127 of the second unbalanced input port. The resistor, which minimizes parasitics, is 12.4 ohms in the preferred embodiment and is suitably in the range of 2 to 50 ohms. Details of the construction of the balun, choke, and splitter are discussed in detail below.

Figure 4:
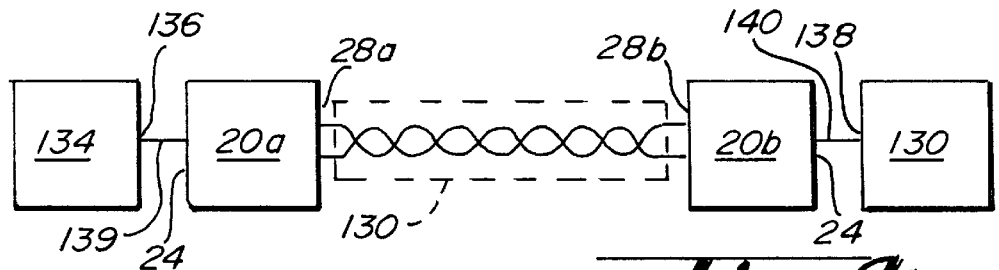
FIG. 4 is a block diagram of an application of the invention.

Referring to FIG. 4 one suitable application of the adapter device is displayed. A specimen 130 of unshielded twisted pair cable is connected to the balanced output ports 28A, 28B of two adapter devices 20A, 20B. A signal generator 134 is connected to the first unbalanced input port 24 of the adapter device 20A and a network analyzer is connected to the first unbalanced input port 24 of the adapter device 20B. The output of the signal generator 136 and the input 138 of the network analyzer 137 both have a first characteristic impedance of substantially 50 ohms. Cable 139 connecting the signal generator to the adapter device and the cable 140 connecting the network analyzer to the adapter device 20B each are 50 ohm coaxial cable. The specimen 130 would be a unshielded twisted pair cable having a second characteristic impedance of 100 ohms. The balun matching the first characteristic impedance to the second characteristic impedance. Thus, a signal of a specific frequency or a signal swept over a broad range of frequencies is detected and analyzed by the network analyzer 131 and appropriate return losses, insertion losses, and other suitable measurements can be determined by a conventional measurement techniques.

Figure 5:
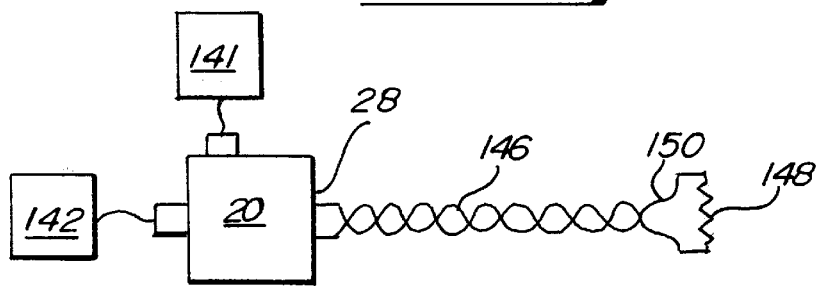
FIG. 5 is block diagram of another application of the invention.

Referring to FIG. 5, an alternative configuration is shown in which an adapter device 20 has a signal generator 141 connected to the second unbalanced input and a network analyzer 142 connected to the first unbalanced input. An unshielded twisted pair of cable 146 is connected to the output port 28 and has a 100 ohm resistor 148 connected at the termination 150 of said cable. Said configuration offers an alternate means of determining specific loss characteristics of the unshielded twisted pair of cable 146.

Referring to FIGS. 10A and 10B, details of the construction of the balun T1 is disclosed. Further specifications and construction procedures are disclosed in Table 1 below. The core is suitably a high permeability core in the range of 7500 or greater.

Table 1

Impedance Matching Transformer (T1):
  Wire used:
    Three strands, for forming a first, second, and third winding of Enameled wire of a diameter 0.0035" or greater. For purposes of this description three colors are used as an example.
    Twist strands of each of the three wires. Then interleave twisted bundles all colors.
  Winding Instructions:
    Wind 2 or more turns of the twisted wire on a toroid core structure with a permeability of greater than 7500. Thread out one color of wire leaving the other two colors twisted. Continue winding the other two twisted wires for 3 or more turns. The first, second, and third winding configured to provide an input impedance of substantially 50 ohms and an output impedance of substantially 100 ohms.

Referring to FIGS. 11A and 11B the longitudinal choke 96 is disclosed and has a first section 156 and a second section 158. The first section has a pair of stacked, cores with one being a relatively low permeability in a preferred embodiment of about 35 and the second stacked core has a permeability of about 750. Generally the permeability should vary by a magnitude of 10 or more.

The larger core in the second section 158 has a permeability in a preferred embodiment of 5,000.

Further details are shown in table 2 below.

Table 2

Choke (T2):
  Wire used:
    Two strands of 36 AWG Teflon wire
    Take 1 strand of each wire and twist.
  Winding instructions:
    Stack one powder iron toroid core with a permeability of about 35 and a diameter not to exceed 0.250" and one ferrite core of similar diameter and a permeability of about 750 together and wind 8 or more turns of the twisted wire. Take one core with a permeability of greater than 4000 and a diameter of no more than 0.200" and wind 8 more turns with the finish of the first set, leaving minimum distance between the two sets.

Each strand of Teflon® wire having a conductor portion and an insulation portion. The conductor portions and insulation portions configured so that the pair of windings has a characteristic impedance substantially matching the second characteristic impedance.

Referring to FIGS. 12A and 12B details of the configuration of the splitter 96 are disclosed. The splitter consists of a pair of cores stacked one with a low permeability 35 and the other with a relatively high permeability of 5,000.

Appropriately the low permeability core is less than or equal to 35. Appropriately the high permeability core is greater than 4,000. Alternatively, the two cores appropriate would have a difference in magnitude of 20 or more. Further details of construction are disclosed in the table below.

Table 3

Splitter (T3):
  Wire used:
  Two strands of 36 AWG Teflon insulated wire.
  Bifilar wound
Winding instructions:
  Stack one powder iron toroid core with a permeability of about 35 and one ferrite core of similar diameter and a permeability of about 750 and bifilar wind 7 or more turns of the Teflon wire.

Figure 6:
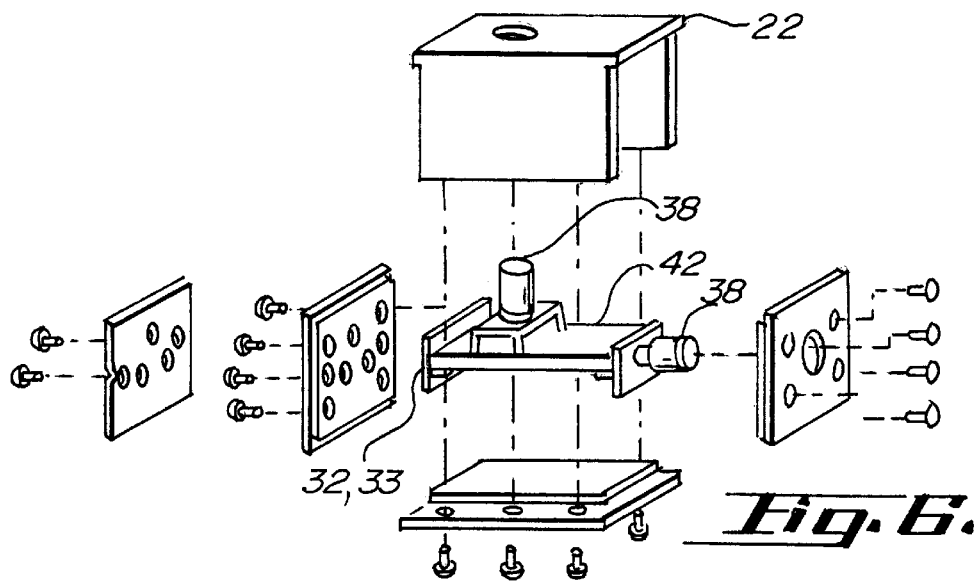
FIG. 6 is an exploded view of a device embodying the invention.

Referring to FIG. 6 details of the assembly of the housing is shown. In the ideal embodiment the housing 22 will be formed of brass although other comparable metals or other conductive materials may be used. The housing contains and encloses the circuit board 42 onto which or in proximity with are located the coaxial connectors 38 and the unshielded twisted pair connectors 32, 33.

Figure 7:
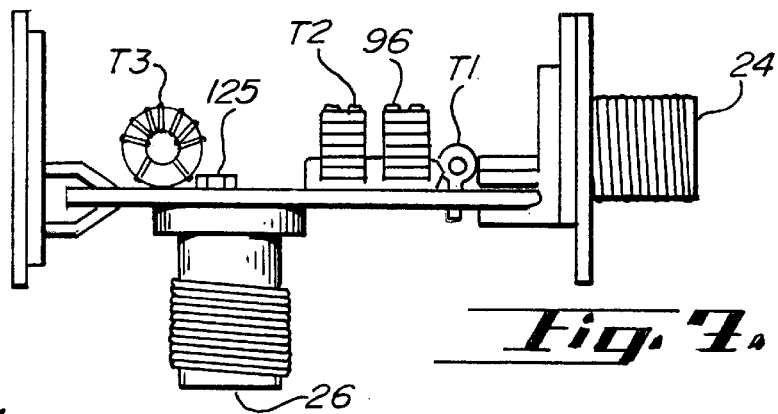
FIG. 7 is a side elevational view of a circuit board including principal components of an embodiment of the invention.
Figure 8:
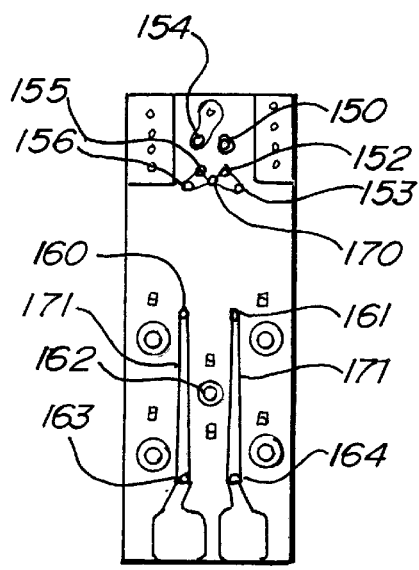
FIG. 8 is a top plan view of a circuit board suitable for the embodiment of FIG. 7.
Figure 9:
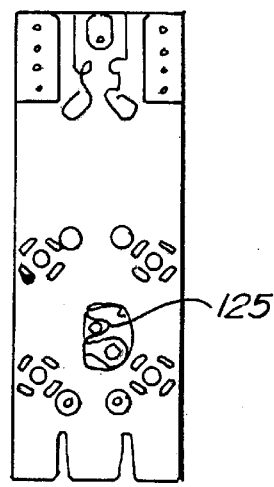
FIG. 9 is a bottom plan view of the circuit board of FIG. 8.

Referring to FIG. 7, 8, 9, the positioning of the various components on the circuit board is disclosed in detail. The first input port 24 is positioned adjacent the balun (T1) 44 which is positioned adjacent the longitudinal common mode choke (T2) 96. Next is the splitter (T3) adjacent to the resistor 125. FIG. 8 discloses the component side of the board and FIG. 9 discloses the solder side of the board. With regard to the component side, juncture 150 is for the T1 single color finish and a second single color wire start. Juncture 152 is for T1 second wire finish. Juncture 153 is for T2 Teflon wire start. Juncture 154 is for T1 third wire start. Juncture 155 is for T1 third wire finish/and T1 second wire start. Juncture 156 is for T2 Teflon wire start. Juncture 160 is for T2 teflon wire finish. Juncture 161 is for T2 teflon wire finish. Juncture 162 is for T3 Teflon wire start and another Teflon wire finish. Juncture 163 is for the T3 Teflon wire finish. Juncture 164 is for the T3 teflon wire start. The element number 170 is a 0.5 picofarads 50 volt capacitor, for example a surface mount multilayer ceramic chip 0603 size capacitor. Said capacitor may appropriately range between 0.1 and 5 picofarads. The output signal conductor 171 are disposed on the circuit board and positioned to maintain the second characteristic impedance.

Figure 13:
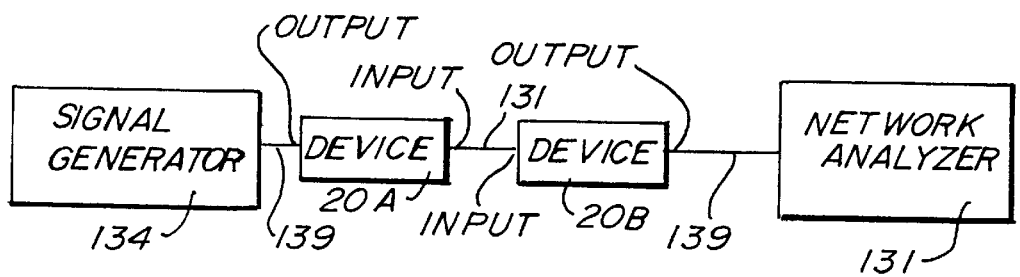
FIG. 13 is a block diagram of an application showing use of two of the inventions for measuring insertion loss of the invention.
Figure 13A:
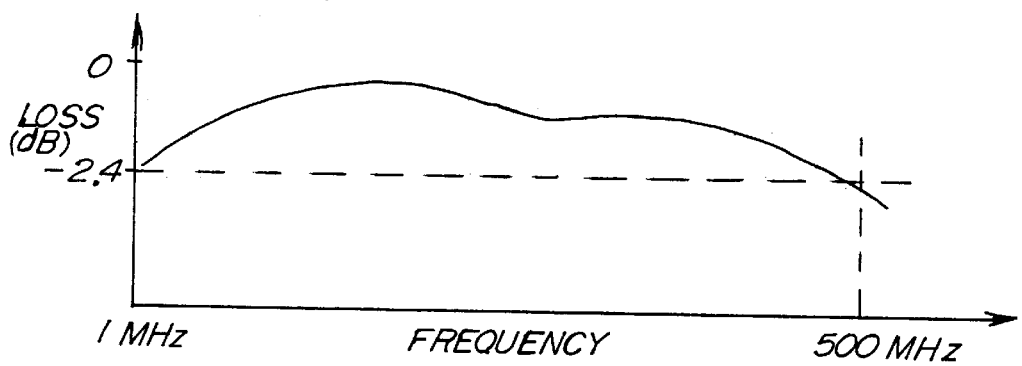
FIG. 13A is a typical frequency response using two of the devices when configured as depicted in FIG. 13.

FIGS. 13, 13A, 14, 14A, 15, 15A, 16, and 16A, depict block diagrams and typical frequency response charts for the analysis and testing of device 20 and are intended to show typical performance of said device 20. Detailed descriptions are as follows:

FIG. 13 depicts a test configuration utilizing two devices (20A and 20B) and for the purposes of measuring insertion loss. Signal generator 134 is electrically coupled to the output side of device 20A by means of first shielded coaxial cable 139. The input side of device 20A is electrically coupled to the input side of device 20B by means of a suitably short segment of balanced, twisted pair telephone wire 131. The output of device 20B is electrically coupled to network analyzer 131 by means of second shielded coaxial cable 139. The second unbalanced input ports on both devices 20A and 20B remain unused in this configuration. Typical frequency response noted using said configuration is depicted in FIG. 3A. It will be appreciated that between the frequencies of 1 MHz and 500 MHz, the total signal loss for this configuration, is 2.4 decibels (dB), or, for a single device 20, 1.2 dB.

Figure 14:
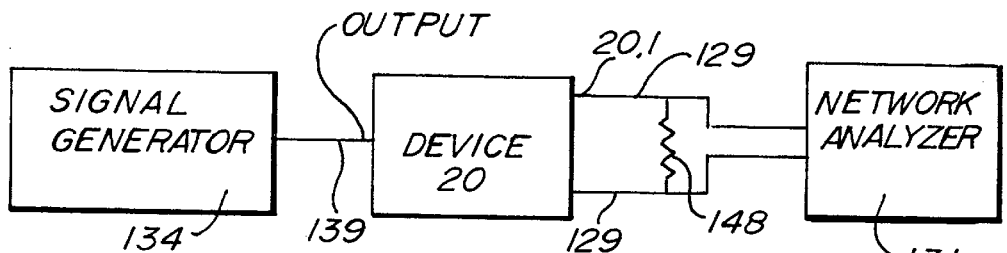
FIG. 14 is a block diagram of an application showing use of the invention for measuring return loss of the invention where the input signal is provided by an unbalanced 50 ohm impedance source and the load is measured across a balanced 100 ohm nominal resistance.
Figure 14A:
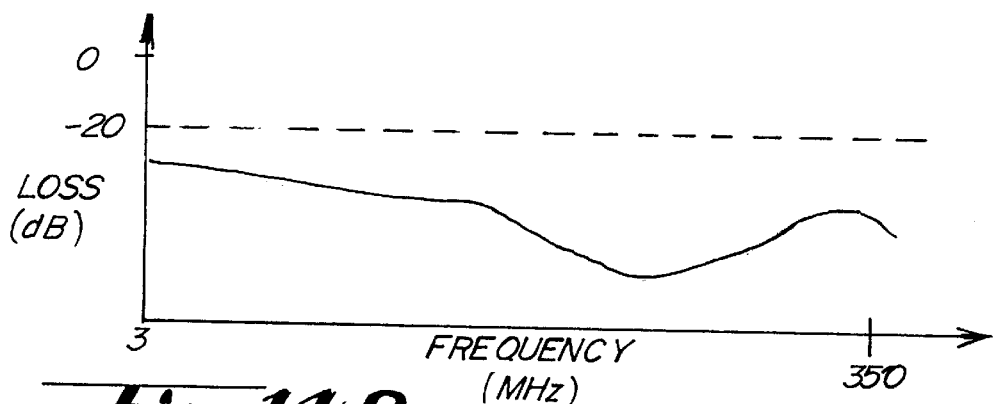
FIG. 14A is a typical frequency response of the device when configured as depicted in FIG. 14.

FIG. 14 depicts a test configuration for the purposes of measuring return loss over a 100 ohm resistor 148 load when excited by a 50 ohm unbalanced signal source. Signal generator 134 is electrically coupled to the output side of device 20 by means of shielded coaxial cable 139. The input side of device 20.1 is electrically coupled to the parallel combination of resistor 148 and network analyzer 131 by means of a suitably short segment of balanced, twisted pair telephone wire 29. Typical frequency response noted using said configuration is depicted in FIG. 4A. It will be appreciated that between the frequencies of 3 MHz and 350 MHz, the return loss of device 20 is a minimum of 20 dB.

Figure 15:
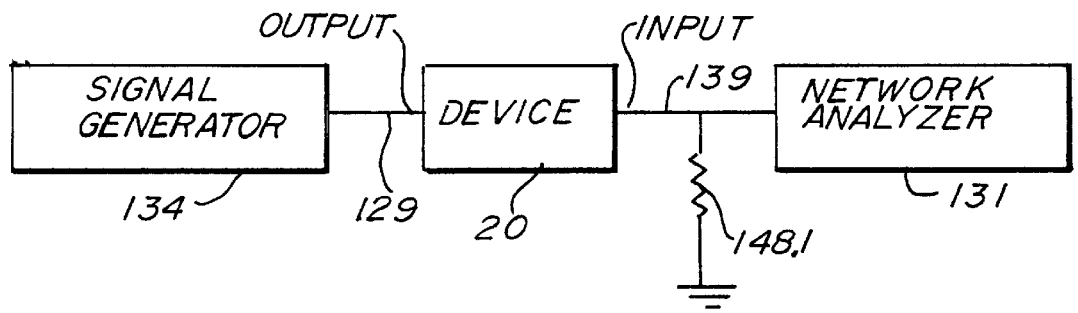
FIG. 15 is a block diagram of an application showing use of the invention for measuring return loss of the invention where the input signal is provided by a balanced 100 ohm impedance source and the load is measured across a 50 ohm nominal resistance.
Figure 15A:
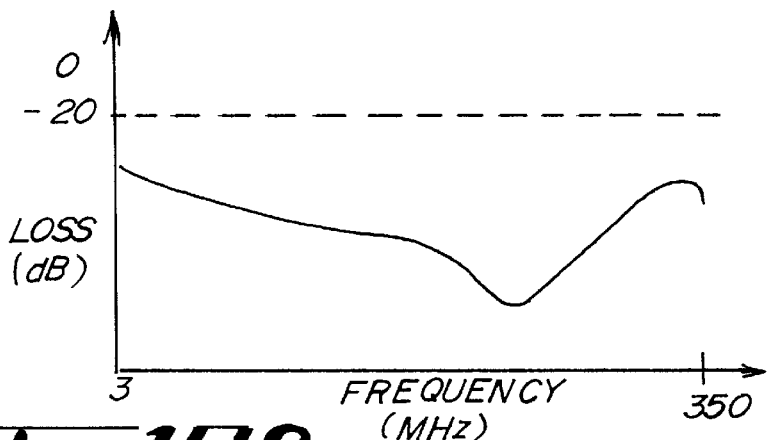
FIG. 15A is a typical frequency response of the device when configured as depicted in FIG. 15.

FIG. 15 depicts a test configuration for the purposes of measuring return loss over a 50 ohm resistor 148.1 load when excited by a 100 ohm balanced signal source. Signal generator 134 is electrically coupled to the input side of device 20 by means of a suitably short segment of balanced, twisted pair telephone wire 129. The output side of device 20 is electrically coupled to the parallel combination of resistor 148.1 and network analyzer 131 by means of suitably short segments of shielded coaxial cable 139. Typical frequency response noted using said configuration is depicted in FIG. 15A. It will be appreciated that between the frequencies of 3 MHz and 350 MHz, the return loss of device 20 is a minimum of 20 dB.

Figure 16:
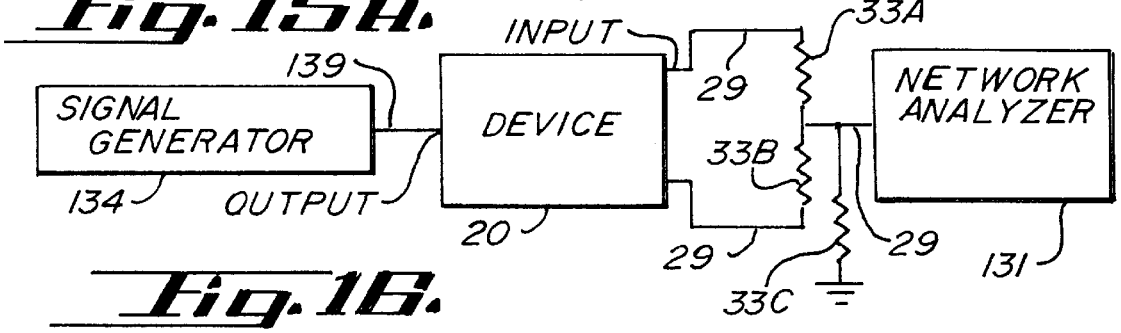
FIG. 16 is a block diagram of an application showing use of the invention for measuring return loss of the invention where the input signal is provided by an unbalanced 50 ohm impedance source and the load is measured across a network of three resistors, each of 50 ohms nominal resistance.
Figure 16A:
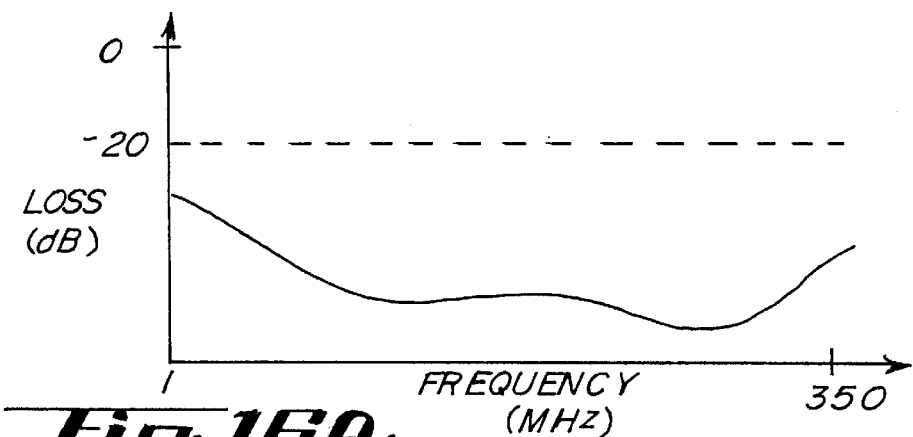
FIG. 16A is a typical frequency response of the device when configured as depicted in FIG. 16.

FIG. 16 depicts a test configuration for the purposes of measuring common mode return loss over a load consisting of a network of three 50 ohm resistors 33A, 33B, and 33C, when excited by a 50 ohm unbalanced signal source. Signal generator 134 is electrically coupled to the output side of device 20 by means of shielded coaxial cable 139. The input side of device 20 is electrically coupled as follows: First port 26 is electrically coupled to first end of resistor 33A. Port 24 is electrically coupled to first end of resistor 33B. The first end of resistor 33C. The second ends of resistors 33A, 33B, and 33C are electrically coupled together and furthermore, electrically coupled to network analyzer 131. The remaining connection of network analyzer 31 is electrically coupled to ground. All connections on the output side of device 20 are by means of suitably short segments of balanced, twisted pair telephone wire 29. Connector 21 on device 20 is unused in this configuration. Typical frequency response noted using said configuration is depicted in FIG. 6A. It will be appreciated that between the frequencies of 1 MHz and 350 MHz, the return loss of device 20 is a minimum of 20 dB.

Still within the scope of the invention component values may be adjusted to provide different operating ranges, for example, a lower range of operation, such as 100 MHz to 10 MHz, which is used in some applications.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. An adapter device for connection between test equipment having unbalanced signal lines with a first characteristic impedance and balanced signal lines to be tested having a second characteristic impedance, the device comprising:

a) a balun comprised of a pair of balun input conductors, a pair of balun output conductors, and a core, the input conductors electrically connectable to the unbalanced signal lines, the balun matching the first characteristic impedance to the second characteristic impedance and for providing a balanced signal at the output conductors, b) a capacitor extending across the balun output conductors, c) a common mode choke comprised of a core, a pair of windings having a pair of input ends and a pair of output ends, the input ends of the windings electrically connected to balun output conductors, the pair of output ends electrically connectable to the pair of balanced signal lines by a pair of output signal conductors; and d) a signal splitter extending across the pair of output signal conductors, the signal splitter having a center tap with a resistor connectable to an unbalanced signal line.

2. The device of claim 1, further comprising a circuit board upon which the balun, the common mode choke, the capacitor, and the signal splitter are mounted, the output signal conductors disposed on the circuit board and positioned to maintain the second characteristic impedance.

3. The device of claim 1, wherein the pair of windings of the common mode choke are twisted together, each of the windings comprising a conductor portion and an insulation portion, the conductor portions and the insulation portions configured so that the pair of windings has a characteristic impedance substantially matching the second characteristic impedance.

4. An adapter device for connection between a first pair of unbalanced signal lines having a first characteristic impedance and a second pair of balanced signal lines having a second characteristic impedance, the device comprising:

a) a balun comprised of a pair of balun input conductors, a pair of balun output conductors, the input conductors electrically connectable to the unbalanced signal line, the balun matching the first characteristic impedance to the second characteristic impedance and for providing a balanced signal at the output conductors, b) a capacitor connected across the output conductors, c) a common mode choke having a pair of input ends and a pair of output ends, the input ends of the windings electrically connected to balun output conductors, the pair of output ends electrically connectable to the pair of balanced signal lines by a pair of output signal conductors, and d) a signal splitter extending across the pair of output signal conductors.

5. The device of claim 4, further comprising a circuit board upon which the balun, the common mode choke, the capacitor, and the signal splitter are mounted, the output signal conductors disposed on the circuit board and positioned to maintain the second characteristic impedance.

6. An adapter for use with a multi-frequency signal generator with an output impedance of substantially 50 ohms and a signal analyzer with an input impedance of approximately 50 ohms for testing the characteristics of a specimen with a characteristic impedance of approximately 100 ohms, the adapter comprising:

a) a first unbalanced input port, with a signal conductor and a shielded conductor connected to ground;

b) a balanced output port with a first conductor and a second conductor, c) a balun comprising:
a core
a first balun input lead connecting to the signal conductor of the input port;
a second balun input lead connecting to the shielded conductor;
a first balun output lead;
a second output lead;

a first winding wound on the core with a first end connecting to the signal conductor of the first unbalanced input port, and a second end connecting to the first balun output lead;

a second winding wound on the core with a first end connecting to the balun output lead, and a second end connecting to ground;

a third winding wound on the core with a first end connecting to ground and a second end connecting to the second balun output lead;

the first, second, and third windings configured to provide an input impedance of substantially 50 ohms and an output impedance of substantially 100 ohms;

d) a longitudinal common mode choke with a pair of input leads connecting to the balun output leads and a pair of output leads connecting to the first and second conductors of the output port;

e) a splitter extending across the first and second conductors of the output port; and f) a capacitor extending across the balun output leads.

7. The device of claim 6, wherein the common mode choke comprises a pair of windings twisted together, each of the windings comprising a conductor portion and an insulation portion, the conductor portions and the insulation portions configured so that the pair of windings has a characteristic impedance substantially matching the second characteristic impedance.

8. The device of claim 6, further comprising a circuit board upon which the balun, the common mode choke, the capacitor, and the signal splitter are mounted, the output signal conductors disposed on the circuit board and positioned to maintain the second characteristic impedance.

9. An adapter for use with a multi-frequency signal generator with an output impedance of substantially 50 ohms and a signal analyzer with an input impedance of approximately 50 ohms for testing the electrical balance of a specimen with a characteristic impedance of approximately 100 ohms, the adapter comprising:

a) a first unbalanced input port with a signal conductor and a shielded conductor connected to ground;

b) a capacitor connected across the signal conductor to ground;

c) a balanced output port with a first conductor and a second conductor, d) a balun comprising:
a core;
a first balun input lead connecting to the signal conductor of the input port;
a second balun input lead connecting to the shielded conductor;
a first balun output lead;
a second balun output lead;
a first winding wound on the core with a first end connecting to the signal conductor of the first unbalanced input port, and a second end connecting to the first balun output lead;
a second winding wound on the core with a first end connecting to the balun output lead, and a second end connecting to ground;
a third winding wound on the core with a first end connecting to ground and a second end connecting to the second balun output lead;
the first, second, and third windings configured to provide an input impedance of substantially 50 ohms and an output impedance of substantially 100 ohms; and e) a longitudinal common mode choke with a pair of input leads connecting to the balun output leads and a pair of output leads connecting to the first and second conductors of the output port.

10. The adapter of claim 9, wherein the pair of windings of the common mode choke are twisted together, each of the windings comprising a conductor portion and an insulation portion, the conductor portions and the insulation portions configured so that the pair of winding has a characteristic impedance substantially matching the second characteristic impedance.

11. The adapter of claim 9, further comprising a circuit board on which the balun, the common mode choke and the capacitor are mounted, the output signal conductors disposed on the circuit board and positioned to maintain the second characteristic impedance.

12. The adapter of claim 9 further comprising a signal splitter having a center tab connected across the first and second conductors of the output port and further comprising an auxiliary unbalanced input port having a signal conductor, said signal conductor attached to the center tap of the signal splitter.

* * * * *